United States Patent
Reiners

(10) Patent No.: US 12,253,432 B2
(45) Date of Patent: Mar. 18, 2025

(54) METHOD AND DEVICE FOR DETECTING ELECTRICAL CURRENT PULSES OCCURRING IN A ROLLING BEARING AS A RESULT OF STATIC CHARGING OF ROTATING MACHINE/SYSTEM PARTS

(71) Applicant: Schaeffler Technologies AG & Co. KG, Herzogenaurach (DE)

(72) Inventor: Harald Reiners, Aachen (DE)

(73) Assignee: Schaeffler Technologies AG & Co. KG, Herzogenaurach (DE)

(*) Notice: Subject to any disclaimer, the term of this patent is extended or adjusted under 35 U.S.C. 154(b) by 254 days.

(21) Appl. No.: 17/912,731

(22) PCT Filed: Mar. 24, 2020

(86) PCT No.: PCT/DE2020/100230
§ 371 (c)(1),
(2) Date: Sep. 19, 2022

(87) PCT Pub. No.: WO2021/190677
PCT Pub. Date: Sep. 30, 2021

(65) Prior Publication Data
US 2023/0142615 A1    May 11, 2023

(51) Int. Cl.
*G01M 13/04* (2019.01)
*F03D 17/00* (2016.01)

(52) U.S. Cl.
CPC ............ *G01M 13/04* (2013.01); *F03D 17/00* (2016.05)

(58) Field of Classification Search
CPC .... F03D 17/033; F03D 17/032; F03D 17/015; G01L 5/0009; G01L 5/0023; G01M 13/04; G01M 13/045
See application file for complete search history.

(56) References Cited

U.S. PATENT DOCUMENTS

| | | | |
|---|---|---|---|
| 4,768,380 A * | 9/1988 | Vermeiren | G01H 1/003 340/682 |
| 4,814,699 A | 3/1989 | Koziel et al. | |
| 4,991,442 A * | 2/1991 | Matsumoto | G01M 13/045 73/660 |

(Continued)

FOREIGN PATENT DOCUMENTS

| | | |
|---|---|---|
| CN | 101405611 A | 4/2009 |
| CN | 203432784 U | 2/2014 |

(Continued)

*Primary Examiner* — Tran M. Tran
(74) *Attorney, Agent, or Firm* — Volpe Koenig

(57) ABSTRACT

A method and to a device for detecting characteristic electrical current pulses flowing through a rolling bearing or sliding bearing as a result of static charging of rotating machine or system parts. The device is provided with a receiving unit with an antenna for receiving electromagnetic radio waves, which electromagnetic radio waves are emitted in the frequency range above 50 MHz as a result of the characteristic electrical current pulses, a signal processing unit for processing the received signal by signal processing in order to extract the current pulse events contained therein, and an analysis unit for analyzing the temporal progression of the current pulse events for state monitoring of the rolling bearing or sliding bearing.

9 Claims, 1 Drawing Sheet

(56) References Cited

U.S. PATENT DOCUMENTS

| | | | | |
|---|---|---|---|---|
| 6,661,235 B2* | 12/2003 | Rokunohe | ......... | G01R 31/1272 324/552 |
| 6,937,027 B2* | 8/2005 | Koo | ................ | G01R 31/1272 324/536 |
| 8,757,003 B1* | 6/2014 | Makaremi | ......... | G01M 5/0033 73/847 |
| 8,994,359 B2* | 3/2015 | Neti | .................... | F03D 7/0272 324/71.1 |
| 9,140,758 B2* | 9/2015 | Marinov | ............. | G01R 31/343 |
| 9,450,392 B2* | 9/2016 | Erichsen | ................ | F03D 17/00 |
| 9,488,754 B2* | 11/2016 | Pabst | .................... | G01W 1/16 |
| 9,551,733 B2* | 1/2017 | Bankeström | ......... | G01M 13/04 |
| 9,841,352 B2* | 12/2017 | Chen | ................. | G01M 13/028 |
| 9,874,107 B2* | 1/2018 | Falb | ....................... | F03D 7/042 |
| 10,768,072 B2* | 9/2020 | Bechhoefer | ........... | G01M 13/00 |
| 10,852,214 B2* | 12/2020 | Qiao | ..................... | F03D 17/00 |
| 10,852,339 B2* | 12/2020 | Birkl | ..................... | F03D 17/00 |
| 10,908,123 B2* | 2/2021 | Dahme | ............... | G01N 29/348 |
| 11,035,346 B2* | 6/2021 | Zhang | ................. | F03D 7/0292 |
| 11,333,131 B2* | 5/2022 | Ramakrishnan | ......... | G01H 1/16 |
| 11,473,564 B2* | 10/2022 | He | ....................... | G01M 13/04 |
| 11,639,966 B2* | 5/2023 | Pamulaparthy | ........ | G06N 20/00 702/58 |
| 11,767,821 B2* | 9/2023 | Meesala | .................. | F03D 7/045 290/44 |
| 12,025,101 B2* | 7/2024 | Wegmann | ............. | F03D 17/036 |
| 2005/0104616 A1* | 5/2005 | Cullen | ................ | G01R 31/343 324/750.02 |
| 2006/0126252 A1* | 6/2006 | Mortensen | ............. | F03D 80/30 361/118 |
| 2010/0077850 A1* | 4/2010 | Matsushita | ............. | F03D 80/30 73/170.24 |

FOREIGN PATENT DOCUMENTS

| | | |
|---|---|---|
| DE | 3543927 A1 | 6/1987 |
| DE | 202017106703 | 12/2017 |
| EP | 1835598 | 9/2007 |
| EP | 2539680 | 1/2013 |
| EP | 2623949 | 8/2013 |
| EP | 3570052 | 11/2019 |
| WO | 2006042844 | 4/2006 |
| WO | 2011104098 | 9/2011 |

* cited by examiner

METHOD AND DEVICE FOR DETECTING ELECTRICAL CURRENT PULSES OCCURRING IN A ROLLING BEARING AS A RESULT OF STATIC CHARGING OF ROTATING MACHINE/SYSTEM PARTS

CROSS-REFERENCE TO RELATED APPLICATIONS

This application is the U.S. National Phase of PCT Appln. No. PCT/DE2020/100230, filed Mar. 24, 2020, the entire disclosure of which is incorporated by reference herein.

TECHNICAL FIELD

The disclosure relates to a method and a device for detecting electrical current pulses occurring as a result of static charging of rotating machine or system parts in a rolling bearing between the bearing outer ring, rolling bodies and bearing inner ring. The disclosure also relates to a computer program product embodying this method and, in a particular application, to a wind power system in which the solution according to the disclosure is implemented.

BACKGROUND

The field of application of the disclosure extends in principle to all rotating machine or system parts that are mounted on a stationary support structure by means of rolling bearings. However, wind power system technology should be highlighted as a special field of application, in which in particular harmful current flows passing through the rotor bearing, which arise as a result of static charging of the rotor blades, can lead to bearing damage. Investigations have shown that such current flows occurring as a result of static charging are a significant factor in the formation of so-called WECs (white etching cracks). WEC is usually understood to mean cracks in the microstructure of the bearing steel, which has local white etching regions consisting of the finest, nanocrystalline, carbide-free ferrite or ferrite with a very fine distribution of carbides. The white etching regions around the cracks are harder than the surrounding, unaffected microstructure of the bearing steel and over time lead to bearing damage. Reliable detection of electrical current flows occurring in the bearing as a result of static charging is therefore a prerequisite for state monitoring of the bearing and, if necessary, introducing maintenance measures in good time.

EP 2 539 680 B1 discloses a technical solution for detecting damage to rolling bearings, but in the context of converter-fed electrical machines, which is not of the type in question. For this, an electrical machine is connected to a converter. To capture a discharge event passing through the rolling bearing, a measurement is carried out in two different frequency bands, wherein the energy of the discharge event is determined in the one to several megahertz range of a frequency band and a coincident event is searched for in another frequency band above one gigahertz, wherein the coincident event shows that a damaging bearing current event must be assumed. This technical solution for detecting bearing currents therefore proves to be quite application-specific and is therefore difficult to transfer to other areas of application.

SUMMARY

The object of the present disclosure is to create a method and a device for detecting current pulses flowing through a rolling or sliding bearing, especially as a result of static charging of rotating machine or system parts, which current pulses can be reliably captured and evaluated using simple technical means.

This object is achieved by means of the method having one or more of the features described herein. A corresponding device and a special application in the context of a wind power system as well as a computer program product embodying the method are also disclosed. Further advantageous developments of the invention are described below and in the claims.

The disclosure includes the procedural teaching that the following steps are carried out for detecting the characteristic electrical current pulses:

receiving electromagnetic radio waves emitted in the frequency range above 50 MHz as a result of the characteristic electrical current pulses;

processing the received signal by signal processing in order to extract the current pulse events contained therein, including filtering;

analyzing the temporal progression of the current pulse events for condition monitoring of the rolling bearing or sliding bearing.

The solution according to the disclosure is based on the finding that the characteristic electrical current pulses generated specifically as a result of static charging of rotating machine or system parts generate radio waves in a typical frequency range, which are visible in the signal curve as a pulse with a very rapid decay phase. These current pulse events allow the current pulse events of interest to be identified in the frequency spectrum.

Envelope formation is preferably used to extract the current pulse events, i.e. the processing of the received signal, which, according to a preferred embodiment, includes high-pass filtering of the received signal followed by rectification and subsequent low-pass filtering. This forms the prerequisite for analyzing the processed signal by simple integration, from a determination of the area per second as a measurement variable, in order to quantify the occurring current pulse events, i.e. to make an evaluation possible.

As an alternative to this, it is also possible for the analysis to be carried out by counting the number of current pulse events of the processed signal per unit of time in order to quantify the occurring current pulse events. In this case, the number per second is used as a measurement variable for the subsequent evaluation.

The method according to the disclosure, which in particular includes special signal processing, can be implemented in an electronic device which preferably consists of a receiving unit, a signal processing unit and an analysis unit. These components can be accommodated, for example, in a detection device that has an interface for connection to a system condition monitoring system or a system controller. For example, the measurement variables obtained can be transferred to a condition monitoring system in the form of an analog signal for further processing and evaluation. As an alternative or in addition to this, it is also conceivable to create a particular detection device as a separate device with a preferably integrated alarm unit. The alarm unit could, for example, emit optical or acoustic signals in order to signal that a critical bearing condition has been reached. Of course, a measurement variable transfer to a higher-level entity can also be integrated into such a local device. The local device can, for example, also be installed in the region inside the bearing housing or in a transmission and is thus protected against external electromagnetic interference.

According to a preferred exemplary embodiment, the device according to the disclosure for detecting characteristic current flows that occur as a result of static charging in a bearing can be integrated in a wind power system. This is because the rotor blades of a wind power system are exposed to a considerable static charge, in particular due to weather-related influences, which is discharged via the rotary bearing. The characteristic current flows that occur here can lead to electrical breakdowns and lightning discharges in the region of the bearing.

It should also be noted that the solution according to the disclosure can also be implemented by a computer program product which runs the program code means for executing the method on a combined microprocessor-controlled signal processing unit with an analysis unit or can be stored on a computer-readable data storage medium.

BRIEF DESCRIPTION OF THE DRAWINGS

Further measures are shown in more detail below together with the description of a preferred exemplary embodiment according to the disclosure based on the figures. In the figures.

DETAILED DESCRIPTION

Figure 1:
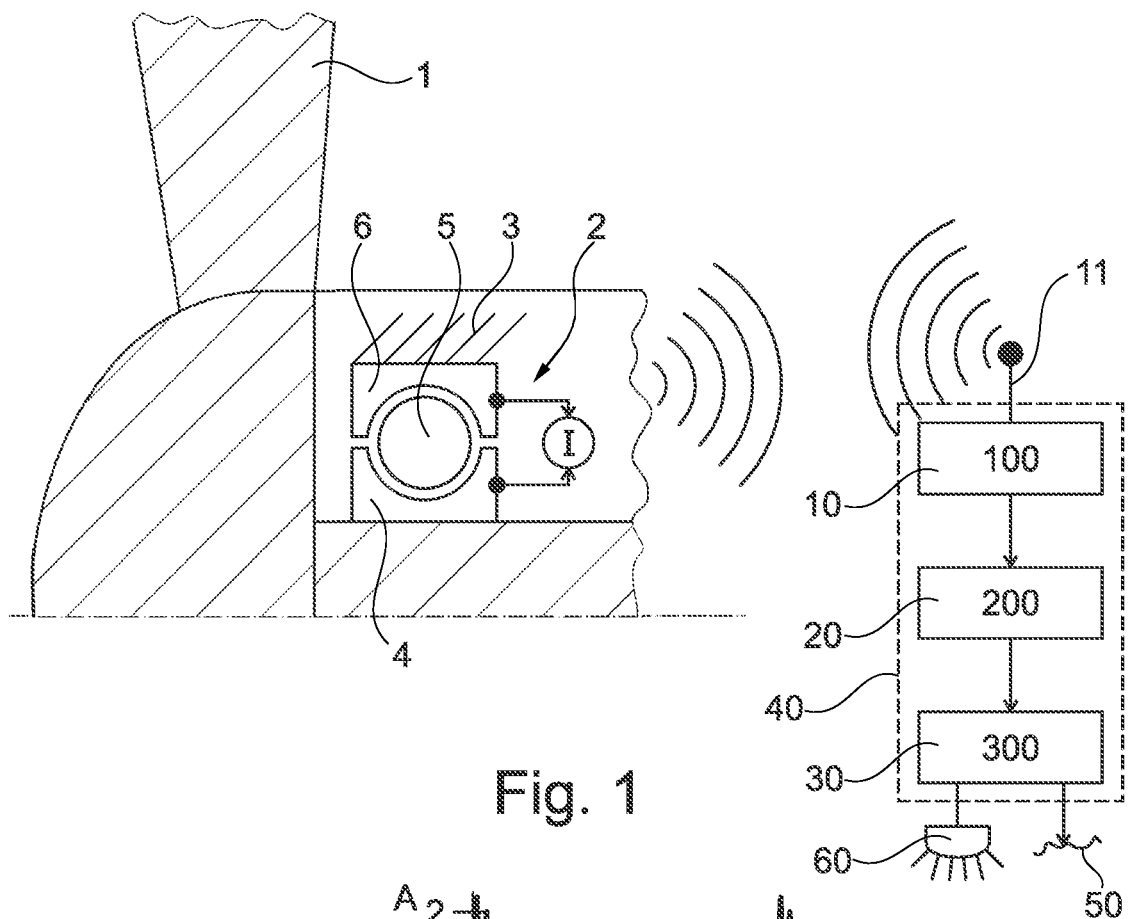
FIG. 1 shows a schematic block diagram representation of a device implemented in a wind power system for detecting electrical current pulses flowing through a rolling bearing as a result of static charging of the rotor.

According to FIG. 1, a wind power system, shown here only schematically, has a rotor 1 which is rotatably mounted via a rolling bearing 2 designed as a rotor shaft bearing on a support structure 3 of a cabin on a tower of the wind power system (not shown in further detail).

During operation, the rotor blades of the rotor 1 experience static charging, which here flows through the rolling bearing 2, from the bearing inner ring 4 via the rolling elements 5 to the bearing outer ring 6 and into the grounded support structure 3. As a result, discharges in the rolling bearing 2 are emitted as electromagnetic radio waves, which are in a typical frequency range above 50 MHz.

A receiving unit 10 installed in the receiving region, i.e. close to the rolling bearing 2, is used for receiving 100 the electromagnetic radio waves via an antenna 11 attached thereto. A downstream signal processing unit 20 is used for processing 200 the received signal by signal processing in order to extract the current pulse events contained therein, which in this exemplary embodiment includes in particular an envelope formation. An analysis unit 30 is used for a subsequent analysis 300 of the temporal progression of the current pulse events for condition monitoring of the rolling bearing 2.

The receiving unit 10 is accommodated along with the signal processing unit 20 and the analysis unit 30 in a common detection device 40 which is connected to a system condition monitoring system (not shown in further detail) via a data transmission interface 50. Furthermore, an alarm unit 60 is also integrated in the detection device 50, which is used as a local optical display of a critical condition.

Figure 2:
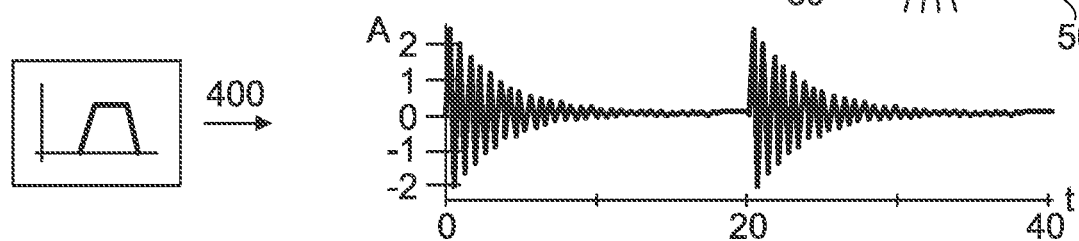
FIG. 2 shows a schematic representation of an envelope formation for processing the received signal as a prerequisite for the signal analysis.
Figure 2:
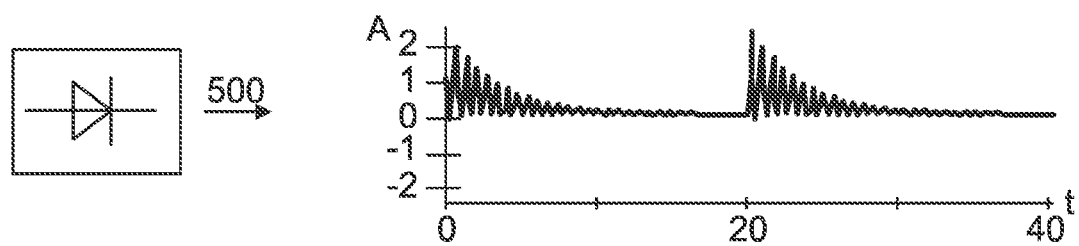
Figure 2:
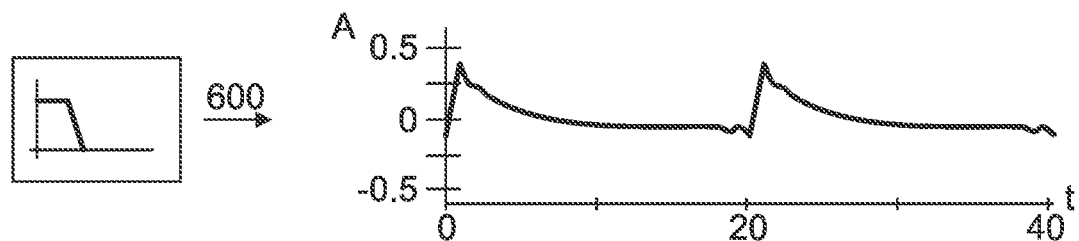

FIG. 2 illustrates the envelope formation that is preferably carried out in the course of the signal processing of the received electromagnetic radio waves. Accordingly, based on the received signal, high-pass filtering 400 first takes place in order to eliminate irrelevant signal components. This is followed by a rectification 500 which cuts away the sub-waves of the signal. Finally, low-pass filtering 600 ensures the formation of the area between the curve and the abscissa axis. This forms the prerequisite for a preferably subsequent integration in order to use the area per unit of time as a measurement variable for the current pulse events that have occurred.

The disclosure is not restricted to the preferred exemplary embodiment described above. Rather, modifications are also conceivable that are included in the scope of protection of the following claims. In particular, the solution according to the disclosure is not only applicable to wind power systems, but generally to non-wired current discharge scenarios. Furthermore, it should be noted that the signal processing for obtaining measurement variables is not limited solely to envelope formation of the received radio signal. Alternatively, sampling methods or other suitable analyzes can also be used for this purpose.

LIST OF REFERENCE SIGNS

1 Rotor
2 Rolling bearing
3 Support structure
4 Bearing inner ring
5 Rolling element
6 Bearing outer ring
10 Receiving unit
11 Antenna
20 Signal processing unit
30 Analysis unit
40 Detection device
50 Data transmission interface
60 Alarm unit
100 Receiving of electromagnetic radio waves
200 Processing of the received signal
300 Analyzing of current pulse events
400 High-pass filtering
500 Rectification
600 Low-pass filtering
I Current flow
A Amplitude
t Time

The invention claimed is:

1. A method for detecting characteristic electrical current pulses flowing through a rolling bearing or sliding bearing as a result of static charging of rotating machine or system parts, the method comprising:
   receiving electromagnetic radio waves emitted in a frequency range above 50 MHz as a result of the characteristic electrical current pulses which are generated by the static charging of the rotating machine or system parts;
   processing, by filtering, received signal by signal processing in order to extract current pulse events contained therein, wherein the processing of the received signal is implemented by an envelope formation comprising high-pass filtering of the received signal followed by rectification and subsequent low-pass filtering, the rectification comprising cutting away sub-waves of the received signal before low-pass filtering; and
   analyzing a temporal progression of the current pulse events for condition monitoring of the rolling bearing or sliding bearing.

2. The method according to claim 1, wherein analyzing the temporal progression includes integration of a processed signal obtained by the low-pass filtering in order to quantify the current pulse events that have occurred.

3. The method according to claim 1, wherein the analyzing includes counting a number of current pulse events of a processed signal per unit of time in order to quantify the current pulse events that have occurred.

4. A device for detecting characteristic electrical current pulses flowing through a rolling bearing or sliding bearing as a result of static charging of rotating machine or system parts, the device comprising:
   a receiving unit configured to receive electromagnetic radio waves emitted in a frequency range above 50 MHz as a result of the characteristic electrical current pulses which are generated by the static charging of the rotating machine or system parts;
   a signal processing unit configured to process, by filtering, a received signal by signal processing in order to extract current pulse events contained therein, wherein processing of the received signal is implemented by an envelope formation comprising high-pass filtering of the received signal followed by rectification and subsequent low-pass filtering, the rectification comprising cutting away sub-waves of the received signal before low-pass filtering; and
   an analysis unit configured to analyze a temporal progression of the current pulse events for condition monitoring of the rolling bearing or sliding bearing.

5. The device according to claim 4, wherein the receiving unit, the signal processing unit and the analysis unit are accommodated in a detection device which has a data transmission interface configured for connection to a system condition monitoring system or a system controller.

6. The device according to claim 5, wherein the detection device is a separate device from the system condition monitoring system or the system controller, and the detection device includes an integrated local alarm unit.

7. A wind power system comprising:
   a rotor as a rotating machine or system part, which is rotatably mounted on a support structure via at least one rolling bearing or sliding bearing provided as a rotor bearing; and
   a device for detecting characteristic electrical current pulses flowing through the at least one rolling bearing or sliding bearing as a result of static charging of the rotating machine or system parts, the device comprising:
      a receiver configured to receive electromagnetic radio waves emitted due to rotation of the rotating machine or system parts via the rolling or sliding bearing in a frequency range above 50 MHz as a result of the characteristic electrical current pulses;
      a signal processer configured to process, by filtering, a received signal from the receiver by signal processing in order to extract current pulse events contained therein, wherein the processing of the received signal is implemented by an envelope formation comprising high-pass filtering of the received signal followed by rectification and subsequent low-pass filtering, the rectification comprising cutting away sub-waves of the received signal before low-pass filtering; and
      a signal analyzer configured to analyze a temporal progression of the current pulse events for condition monitoring of the rolling bearing or sliding bearing;
   wherein the device is arranged in proximity to the rolling bearing or sliding bearing for detecting the characteristic current flows occurring as a result of static charging of the rotor in the at least one rolling bearing or sliding bearing between a bearing outer ring and a bearing inner ring.

8. The wind power system according to claim 7, wherein the signal processer and the signal analyzer are located in a detection device that includes a data transmission interface configured for connection to a system condition monitoring system or a system controller.

9. The wind power system according to claim 8, wherein the detection device is a separate device from the system condition monitoring system or the system controller, and the detection device includes, and the detection device includes an integrated alarm.

* * * * *